(12) United States Patent
Hackenberg

(10) Patent No.: US 7,097,714 B2
(45) Date of Patent: Aug. 29, 2006

(54) PARTICULATE REMOVAL FROM AN ELECTROSTATIC CHUCK

(75) Inventor: John J. Hackenberg, Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 110 days.

(21) Appl. No.: 10/740,171

(22) Filed: Dec. 18, 2003

(65) Prior Publication Data
US 2005/0056305 A1 Mar. 17, 2005

Related U.S. Application Data

(60) Provisional application No. 60/503,701, filed on Sep. 17, 2003.

(51) Int. Cl.
*B08B 5/04* (2006.01)

(52) U.S. Cl. .............. 134/21; 134/30; 134/34; 134/37; 134/42; 15/300.1; 15/301; 15/303; 15/306.1; 15/309.2; 15/345; 15/346; 156/345.33

(58) Field of Classification Search ............ 134/21, 134/30, 37, 42, 34; 15/345, 346, 301, 300.1, 15/303, 306.1, 309.2; 156/345.33
See application file for complete search history.

(56) References Cited

U.S. PATENT DOCUMENTS

| | | | |
|---|---|---|---|
| 5,507,874 A * | 4/1996 | Su et al. ................ 134/1 |
| 6,170,496 B1 * | 1/2001 | Chen et al. ............ 134/102.1 |
| 6,821,350 B1 * | 11/2004 | Krogh ................... 134/3 |
| 2002/0153024 A1 * | 10/2002 | Akiba ................... 134/1.1 |

* cited by examiner

*Primary Examiner*—Zeinab El-Arini
(74) *Attorney, Agent, or Firm*—Fogg and Associates LLC; Scott V. Lundberg

(57) ABSTRACT

The cleaning of particles from an electrostatic chuck. In one embodiment, a method of cleaning an electrostatic chuck in a processing chamber is disclosed. The method comprises directing a flow of gas across the electrostatic chuck to dislodge particles from the electrostatic chuck and removing the flow of gas and particles through an exhaust port in the processing chamber. In this embodiment, the vacuum integrity of the chamber is not compromised during the cleaning of the electrostatic chuck.

13 Claims, 6 Drawing Sheets

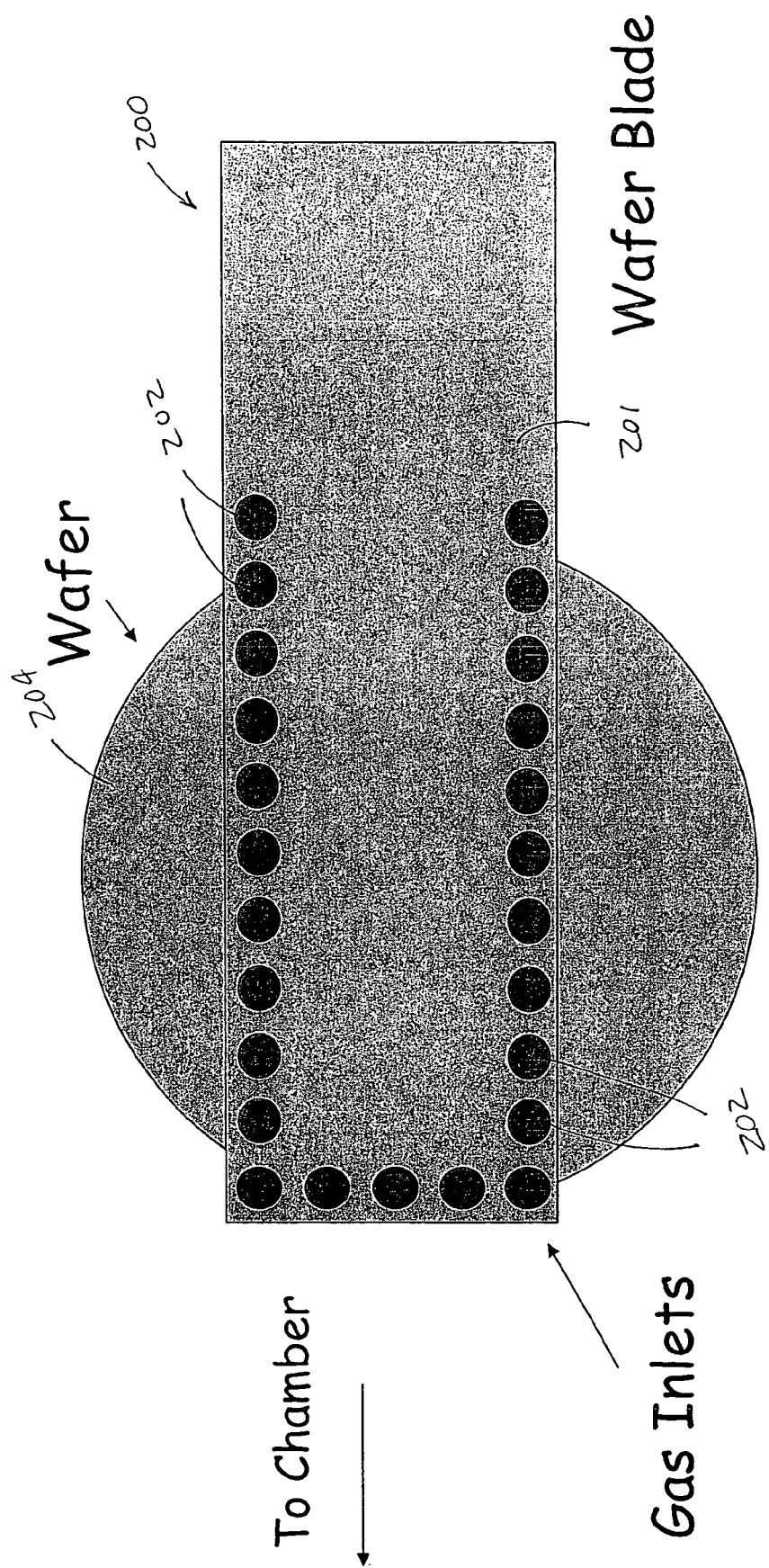

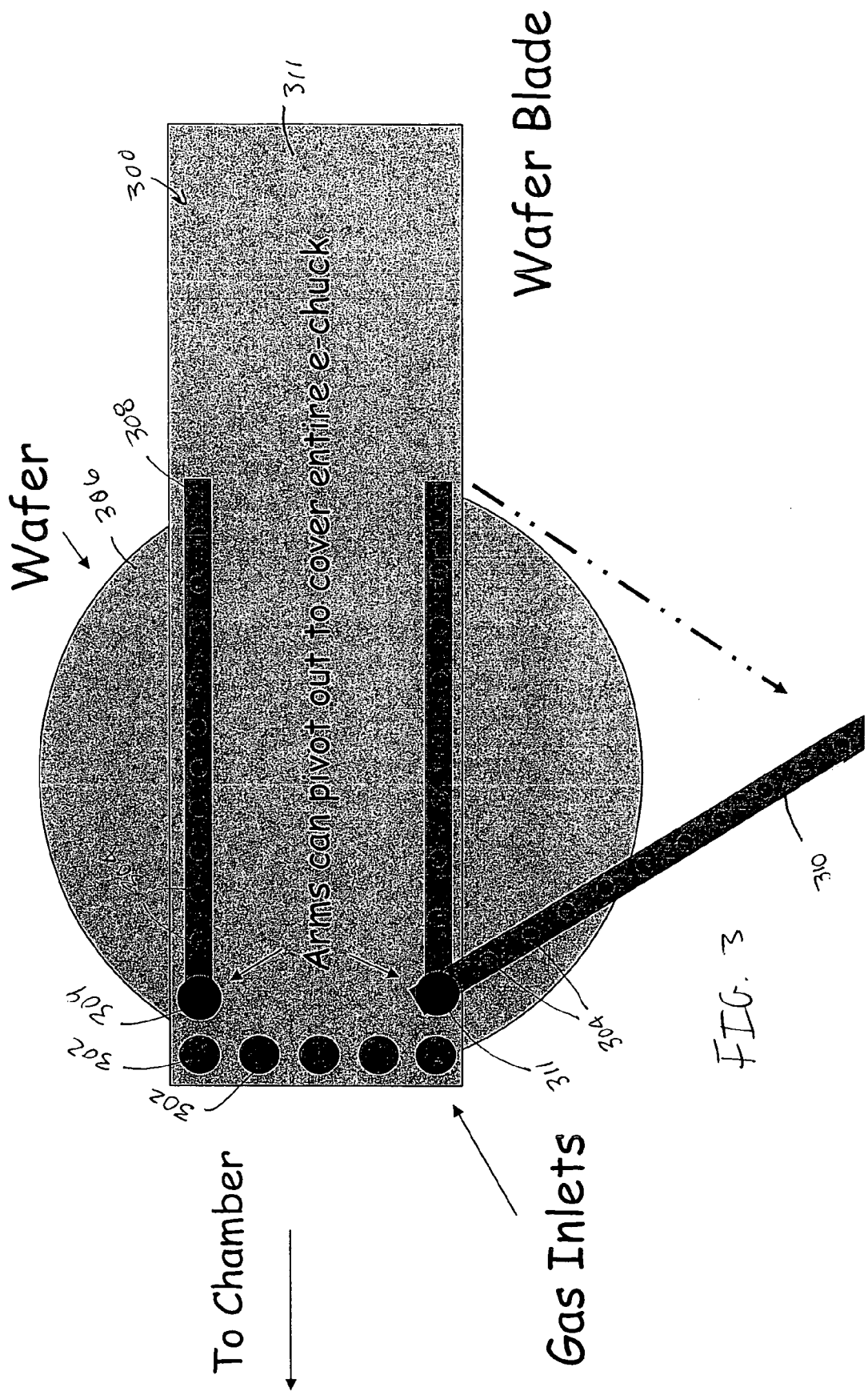

PARTICULATE REMOVAL FROM AN ELECTROSTATIC CHUCK

CROSS REFERENCE TO RELATED APPLICATIONS

This application is related to and claims the benefit under 35 USC 119(e) of Provisional Application Ser. No. 60/503,701 (the '701 Application), filed on Sep. 17, 2003. The '701 Application is incorporated by reference

TECHNICAL FIELD

The present invention relates generally to electrostatic chuck and in particular the present invention relates to the cleaning of particles from an electrostatic chuck.

BACKGROUND OF THE INVENTION

Electrostatic chucks (e-chucks) are used in processing semiconductor devices. In particular, e-chucks are used to hold a semiconductor wafer in place during processing. Processing of the wafer typically takes place in a vacuum processing chamber. As stated above, the e-chucks hold the wafer in place while it is being processed in the processing chamber. An e-chuck is generally a capacitor element having a conductor/insulator structure that is adapted to selectively generate an electrostatic filed between the wafer and an e-chuck to selectively hold the wafer in place during processing. During processing, particles as the result of the processing can accumulate on the e-chuck. For example, processes such as depositions and etching can create particles that can accumulate on the e-chucks. These particles can compromise the surface of the e-chuck causing the e-chuck to no longer effectively hold a wafer in place during processing. If a wafer is dislodged as a result of an accumulation of particles, the wafer is either scrapped or reprocessed. If the problem persists, the general practice in the art is venting the chamber and manually cleaning the e-chuck. This, however, creates a significant loss in manufacturing time.

For the reasons stated above and for other reasons stated below which will become apparent to those skilled in the art upon reading and understanding the present specification, there is a need in the art for a method effectively removing particles from the surface of the e-chuck without venting the chamber

SUMMARY OF THE INVENTION

The above-mentioned problems and limitations existing in the prior art are addressed by embodiments of the present invention and will be understood by reading and studying the following specification.

In one embodiment, a method of cleaning an electrostatic chuck in a processing chamber is disclosed. The method comprises directing a flow of gas across the electrostatic chuck to dislodge particles from the electrostatic chuck and removing the flow of gas and particles through an exhaust port in the processing chamber. In this embodiment, the vacuum integrity of the chamber is not compromised during the cleaning of the electrostatic chuck.

In yet another embodiment, a semiconductor processing chamber system is disclosed. The chamber system includes a vacuum chamber, an electrostatic chuck, one or more gas inlets and one or more exhaust ports. The vacuum chamber is used to provide a pressure regulated environment. The electrostatic chuck received in the vacuum chamber adapted to selectively hold a wafer to be processed. The one or more gas inlets are adapted to direct a flow of gas on a surface of the electrostatic chuck to remove particles accumulated on the electrostatic chuck surface. Moreover, the one or more exhaust ports are adapted to remove the flow of gas and particles from the chamber without breaking the vacuum integrity of the vacuum chamber.

In still another embodiment, a wafer blade for placing and removing wafers on and from an electrostatic chuck in a semiconductor processing chamber is disclosed. The wafer blade comprises a first surface and a second surface. The first surface is adapted to face the electrostatic chuck, the first surface has one or more gas inlets adapted to direct one or more flows of gas to a surface of the electrostatic chuck to remove particles form the surface of the electrostatic chuck. The second surface adapted to engage a wafer.

BRIEF DESCRIPTION OF THE DRAWINGS

The present invention can be more easily understood and further advantages and uses thereof more readily apparent, when considered in view of the description of the preferred embodiments and the following figures in which:

FIG. 2A is a bottom view of a wafer blade of one embodiment of the present invention;

FIG. 3 is a bottom view of a wafer blade of another embodiment of the present invention;

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

The present invention allows for a situ cleaning of the surface of the e-chuck without the need to break the vacuum integrity of the chamber and without the loss in production time related to venting and manually cleaning the e-chuck. Embodiments of the present invention accomplish this by directing a gas flow across the e-chuck. As a result the particles are removed with the flow of gas. The gas is then vented through an exhaust port common to vacuum chambers without breaking the vacuum integrity of the chamber.

Figure 1:
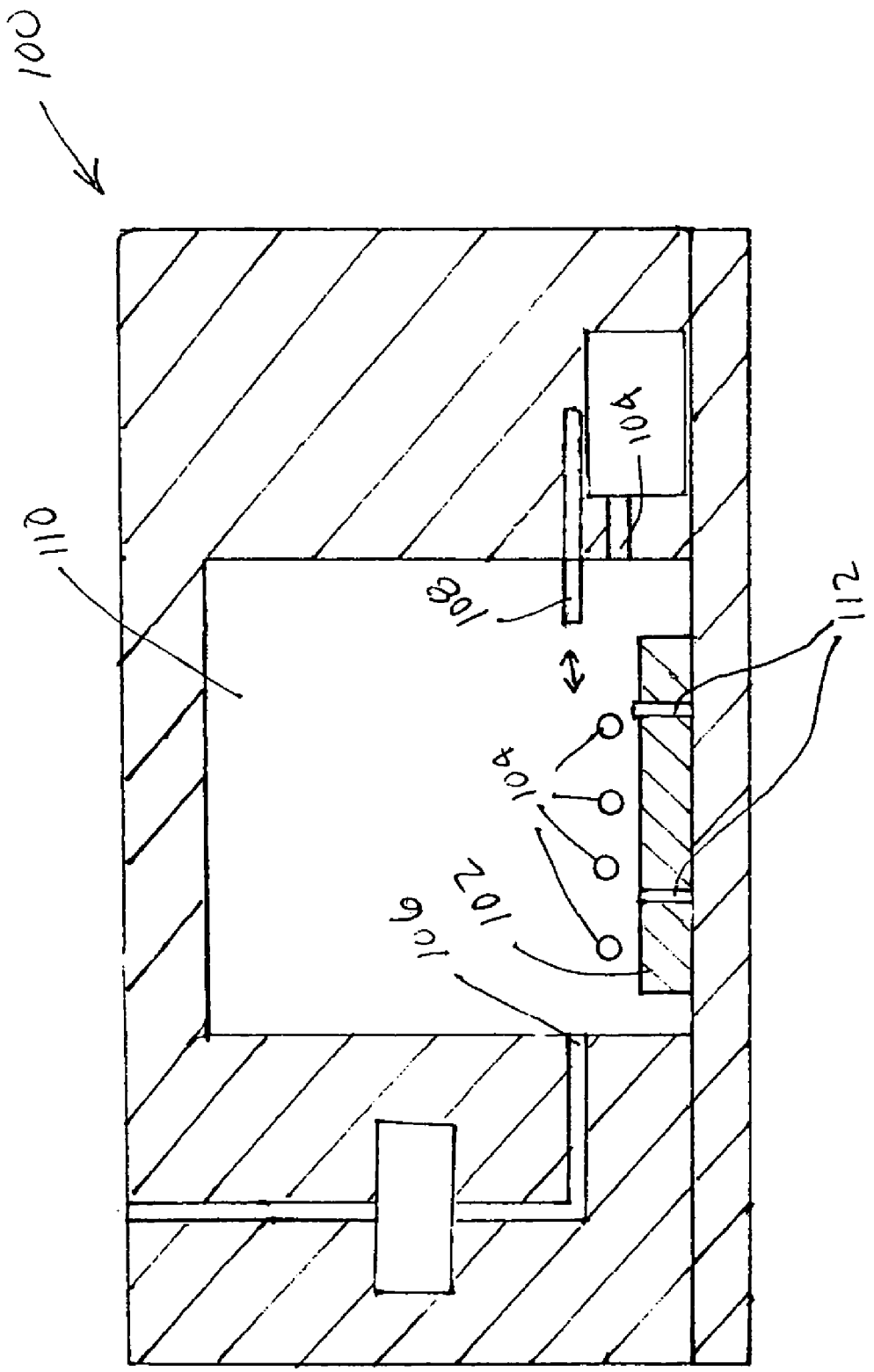
FIG. 1 is a cross-sectional side view of a processing vacuum chamber of one embodiment of the present invention.

One embodiment of a processing chamber of the present invention is illustrated in the cross-sectional side view of FIG. 1. FIG. 1 includes an e-chuck 102 in a chamber 110. The chamber 110 includes gas inlets 104 that provide a flow of gas to remove accumulated particles on the e-chuck 102. The gas flow and particles are removed through the exhaust outlet 106. This is accomplished without breaking the vacuum of the chamber 110. Although, this embodiment only illustrates one exhaust output 106, other embodiments include more than one exhaust outputs 106. Also illustrated in FIG. 1, is a wafer blade 108. The wafer blade 108 is used to remove and place wafers on the e-chuck. The blade 108 is adapted to move into and out of the chamber 110. The wafer blade 108 works in concert with wafer pins 112 to remove and place wafers on the e-chuck. In particular, the pins 112 are adapted to move up and out of the e-chuck 102 to receive wafers from the blade 108. The pins 112 are further adapted to move down into the e-chuck 102 to place the wafer on the e-chuck 102. The pins 112 are further adapted to remove a wafer by moving up and out of the e-chuck 102 and engaging the wafer. The blade 108 is then adapted to remove the wafer from the pins 112.

Figure 2B:
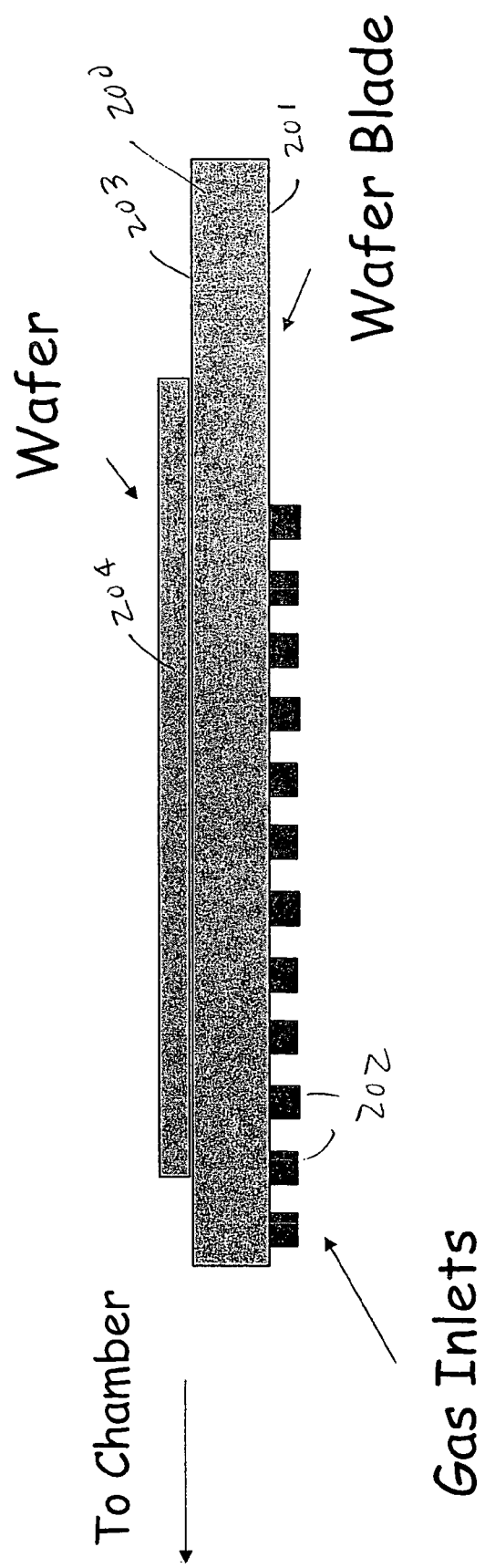
FIG. 2B, is a side view of wafer blade of one embodiment of the present invention.

In one embodiment of the present invention, the wafer blade 108 is adapted to provide the stream of gas that removes the particles from the e-chuck 112. An example of a wafer blade 200 of this embodiment is illustrated in FIG. 2. As the bottom view of the embodiment of FIG. 2 illustrates, a bottom (first surface) 201 has a plurality of gas inlets 202 that provide the stream of gas that removes the accumulated particles from the e-chuck. The advantage to this embodiment is that as the wafer blade 200 is moved across the e-chuck 112 (please refer to FIG. 1) when placing and removing wafers 204 from the e-chuck 112, the flow of gas provided by the wafer blade 200 is provided in close proximity to the e-chuck 112. In one embodiment, the gas is adapted to flow each time a wafer 204 is placed on the e-chuck 112. In another embodiment, the gas is adapted to flow each time a wafer 204 is removed from the e-chuck 112. In still another embodiment, the gas is adapted to flow each time a wafer 204 is place and removed from the e-chuck 112. Still further in other embodiments, the wafer blade 200 is passed over its associated e-chuck one or more times without a wafer on the e-chuck to remove the accumulated particles. Referring to FIG. 2B a side view of the wafer blade 200 of FIG. 2A is illustrated. As FIG. 2B illustrates, the gas inlets 202 extend from a bottom (first surface) 201 of the wafer blade 200. A top (second surface) 203 of the wafer blade 200 is adapted to engage a wafer 204. The bottom surface 201 of the wafer blade is adapted to face an associated e-chuck.

Referring to FIG. 3, another embodiment of a wafer blade 300 is illustrated. FIG. 3, is a bottom view of the wafer blade 300 of this embodiment. As illustrated, the wafer blade 300 includes gas inlets 302 on the bottom surface (first surface) 311 of the wafer blade 300. A top surface (second surface) (not shown) of the wafer blade 300 is adapted to engage a wafer 306. In this embodiment, arms 308 and 310 are pivotally coupled to the bottom surface 311 of the wafer chuck 300 by respective pivot connections 109 and 311. As illustrated, arms 308 and 310 have gas inlets 304. In this embodiment, the arms are adapted to pivot out away from the wafer blade during an e-chuck cleaning. When the arms 308 and 310 are pivoted away from the wafer blade 300 more of the surface area of the e-chuck is subjected to the gas flow at a closer proximity to the gas inlets 302 and 304.

Figure 5:
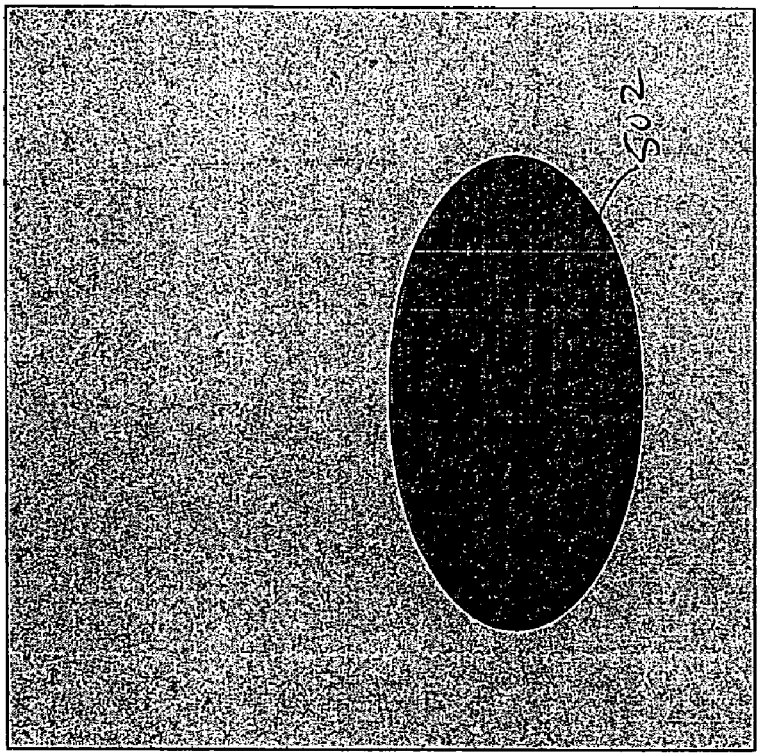
FIG. 5, is a close up view of an oval opening of a gas inlet of one embodiment of the present invention.
Figure 4:
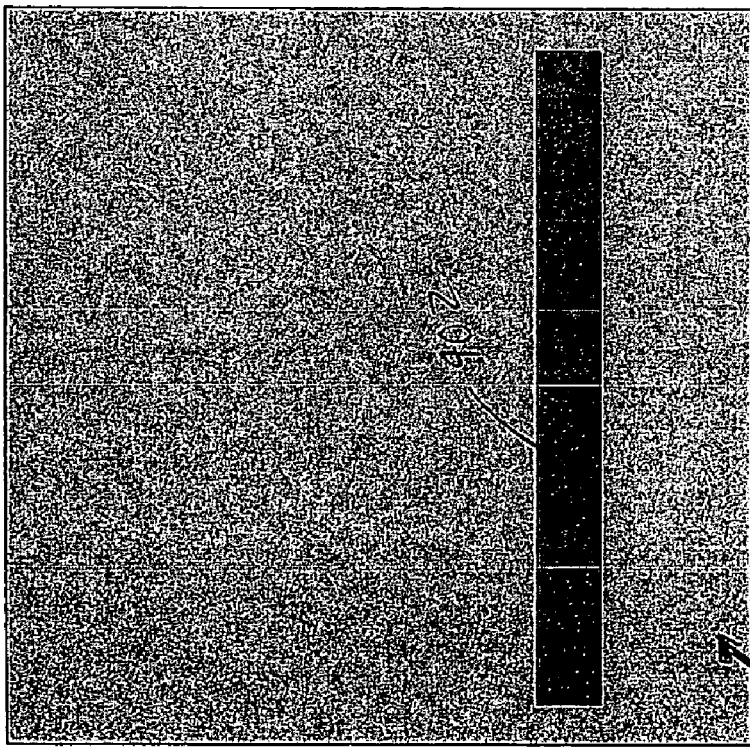
FIG. 4, is a close up view of a slit opening of a gas inlet of one embodiment of the present invention.
Figure 6:
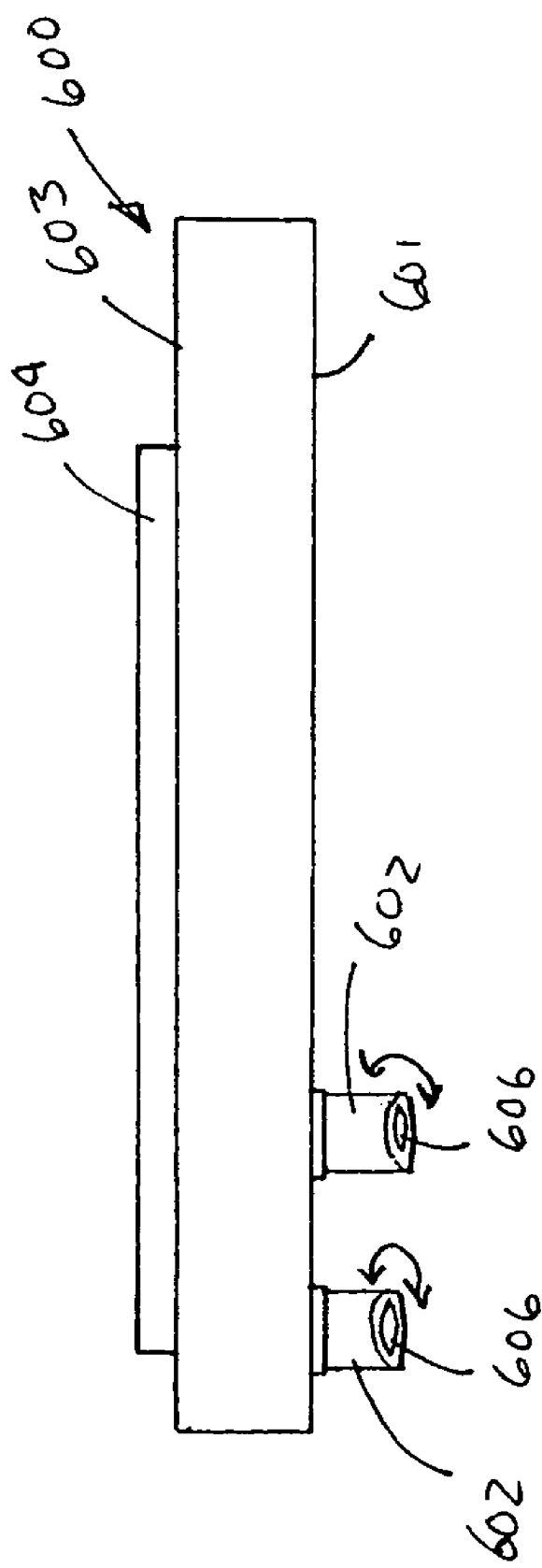
FIG. 6, is a side view of an embodiment of a rotatable nozzle of a gas inlet of one embodiment of the present invention.

The embodiments openings of the gas inlets 104, 202, 302 and 304 of FIGS. 1, 2A, 3B and 3 are illustrated as generally being round in shape, in other embodiments this is not the case. For example, in the embodiment of FIG. 4, the gas inlets 400 openings 402 are generally a rectangular slot and in the embodiment of FIG. 5, the gas inlets 500 openings 502 are generally oval in shape. In yet another example, the gas inlets are adapted to rotate to disburse the gas flow in different directions. This embodiment is illustrated in the side view of a wafer blade 600 of FIG. 6. As illustrated, the gas inlets 602 are coupled to a bottom surface (first surface) 601 of wafer blade 600. A top surface (second surface) is adapted to selectively engage a wafer 604. The gas inlets 602 of this embodiment are adapted to rotate as the flow of gas is being expelled from their respective openings 606. With this embodiment, one or more gas inlets 602 rotate to expel the gas flow across generally the entire surface of an associated e-chuck to remove accumulated particles.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of cleaning an electrostatic chuck in a processing chamber, the method comprising:
   directing a flow of gas across the electrostatic chuck to dislodge particles from the electrostatic chuck;
   removing the flow of gas and particles through an exhaust port in the processing chamber, wherein a vacuum integrity of the chamber is not compromised during the cleaning of the electrostatic chuck; and
   wherein the flow of gas comes from gas inlets in a wafer blade to provide the flow of gas proximate the electrostatic chuck.

2. The method of claim 1, further comprising:
   directing the flow of gas each time a wafer is removed from the electrostatic chuck.

3. The method of claim 1, directing the flow of gas each time a wafer is being place on the electrostatic chuck.

4. The method of claim 1, further comprising:
   directing the flow of gas each time a wafer is placed on and removed from the electrostatic chuck.

5. A method for cleaning an electrostatic chuck in a processing chamber, the method comprising:
   directing a flow of gas from a wafer blade to the electrostatic chuck to remove particles from the electrostatic chuck.

6. The method of claim 5, further comprising:
   removing the flow of gas and particles through an exhaust port in the processing chamber.

7. The method of claim 5, further comprising:
   maintaining a vacuum integrity of the processing chamber during the removal of particles from the electrostatic chuck.

8. The method of claim 5, further comprising:
   rotating gas inlets on the wafer blade to disburse the gas flow in different directions.

9. The method of claim 5, further comprising:
   rotating at least one arm coupled to the wafer blade away from the wafer blade; and
   directing the flow of gas from the at least one arm.

10. The method of claim 5, further comprising:
placing a wafer on the wafer blade.

11. The method of claim 5, further comprising;
removing a wafer from the electrostatic chuck.

12. The method of claim 5, further comprising:
moving a wafer blade approximate the electrostatic chuck.

13. The method of claim 12, wherein moving a wafer blade approximate the electrostatic chuck further comprises:
moving the wafer blade to position the wafer on the electrostatic chuck. across the surface of the electrostatic chuck.

* * * * *

UNITED STATES PATENT AND TRADEMARK OFFICE
CERTIFICATE OF CORRECTION

PATENT NO. : 7,097,714 B2  
APPLICATION NO. : 10/740171  
DATED : August 29, 2006  
INVENTOR(S) : Hackenberg Page 1 of 1

It is certified that error appears in the above-identified patent and that said Letters Patent is hereby corrected as shown below:

At Claim 13, Column 6, Line 4, delete "across the surface of the electro-"
At Claim 13, Column 6, Line 5, delete "static chuck."

Signed and Sealed this
Twenty-third Day of August, 2011

David J. Kappos
*Director of the United States Patent and Trademark Office*